US009599788B2

United States Patent
Horn et al.

(10) Patent No.: US 9,599,788 B2
(45) Date of Patent: Mar. 21, 2017

(54) OPTICAL MODULE (71) Applicant: Carl Zeiss SMT GmbH, Oberkochen (DE)

(72) Inventors: Jan Horn, Munich (DE); Benedikt Knauf, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 14/809,431

(22) Filed: Jul. 27, 2015

(65) Prior Publication Data

US 2016/0025952 A1 Jan. 28, 2016

Related U.S. Application Data (63) Continuation of application No. PCT/EP2014/053657, filed on Feb. 25, 2014.
(Continued)

(30) Foreign Application Priority Data

Feb. 25, 2013 (DE) .................... 10 2013 203 035

(51) Int. Cl.
*G03B 27/54* (2006.01)
*G02B 7/182* (2006.01)
(Continued)

(52) U.S. Cl.
CPC ......... *G02B 7/1827* (2013.01); *G02B 5/0891* (2013.01); *G02B 5/09* (2013.01);
(Continued)

(58) Field of Classification Search
CPC .................... G03F 7/70141; G03F 7/70825
(Continued)

(56) References Cited

U.S. PATENT DOCUMENTS

| 6,906,845 B2 | 6/2005 | Cho et al. | |
|---|---|---|---|
| 2007/0097485 A1* | 5/2007 | Yang | G02B 26/0841 359/290 |
| 2008/0030841 A1* | 2/2008 | Gong | G02B 26/0841 359/291 |

FOREIGN PATENT DOCUMENTS

| DE | 102 05 425 A1 | 5/2003 |
|---|---|---|
| DE | 102 00 244 A1 | 7/2003 |

(Continued)

OTHER PUBLICATIONS

International Search Report and Written Opinion for corresponding PCT/EP2014/053657 dated Jul. 14, 2014.
(Continued)

*Primary Examiner* — Hung Henry Nguyen
(74) *Attorney, Agent, or Firm* — Fish & Richardson P.C.

(57) ABSTRACT

The present invention relates to an optical module, in particular facet mirror, comprising an optical element and a supporting structure for supporting the optical element, wherein the supporting structure comprises a positioning device for actively setting a position and/or orientation of the optical element in at least one degree of freedom. The supporting structure comprises a selectively activatable contacting device having at least one contacting unit having a first contact section, wherein the first contact section, in an activated state of the contacting device, contacts a second contact section of the optical element in order to exert a contact force on the optical element, while the first contact section, in a deactivated state of the contacting device is removed from the second contact section.

31 Claims, 4 Drawing Sheets

Related U.S. Application Data (60) Provisional application No. 61/768,652, filed on Feb. 25, 2013.

(51) Int. Cl.
　　*G02B 5/09*　　　(2006.01)
　　*G02B 26/08*　　(2006.01)
　　*G03F 7/20*　　　(2006.01)
　　*G02B 5/08*　　　(2006.01)
　　*G02B 19/00*　　(2006.01)
　　*G21K 1/06*　　　(2006.01)

(52) U.S. Cl.
　　CPC ....... *G02B 7/1822* (2013.01); *G02B 19/0095* (2013.01); *G02B 26/0833* (2013.01); *G03F 7/702* (2013.01); *G03F 7/70075* (2013.01); *G03F 7/70116* (2013.01); *G03F 7/70141* (2013.01); *G03F 7/70825* (2013.01); *G21K 1/067* (2013.01)

(58) Field of Classification Search
　　USPC .............................. 355/53, 67; 359/290–292
　　See application file for complete search history.

(56) References Cited

FOREIGN PATENT DOCUMENTS

| EP | 0 916 984 A1 | 5/1999 |
| WO | WO 03/050586 A2 | 6/2003 |
| WO | WO 2012/013227 A1 | 2/2012 |
| WO | WO 2012/175116 A1 | 12/2012 |

OTHER PUBLICATIONS

German Office Action, with English translation thereof, for DE Appl No. 10 2013 203 035.5, dated Dec. 6, 2013.

* cited by examiner

OPTICAL MODULE

CROSS-REFERENCE TO RELATED APPLICATIONS

The present application is a continuation of, and claims benefit under 35 USC 120 to, international application PCT/EP2014/053657, Feb. 25, 2014, which claims benefit under 35 USC 119 of German Application No. 10 2013 203 035.5, filed Feb. 25, 2013 and under 35 USC 119(e) of U.S. Ser. No. 61/768,652, filed Feb. 25, 2013. The entire disclosure of international application PCT/EP2014/053657 is incorporated by reference herein.

BACKGROUND OF THE INVENTION

The present invention relates to an optical module, an optical imaging device, a method for supporting an optical element, an optical imaging method, and a method for structuring a contact section of an optical module. The invention can be applied in connection with any desired optical devices and optical imaging methods. In particular, it can be used in connection with the micro lithography used in the production of microelectronic circuits.

Particularly in the field of microlithography, besides using components configured with the highest possible precision, it is necessary, inter alia, to set the position and geometry of optical modules of the imaging device, that is to say for example of the modules having optical elements such as lens elements, mirrors or gratings but also of the masks and substrates used, during operation as precisely as possible in accordance with predefined desired values or to stabilize such components in a predefined position or geometry, in order to achieve a correspondingly high imaging quality.

In the field of microlithography, the accuracy requirements are in the microscopic range of the order of magnitude of a few nanometers or less. They are not least a consequence of the constant need to increase the resolution of the optical systems used in the production of microelectronic circuits, in order to advance the miniaturization of the microelectronic circuits to be produced.

With the increased resolution and the generally accompanying reduction of the wavelength of the light used, the requirements made regarding the accuracy of the positioning and orientation of the components used naturally increase. In particular for the short operating wavelengths used in microlithography in the UV range (for example in the range of 193 nm), but in particular in the so-called extreme UV range (EUV) with operating wavelengths of between 5 nm and 20 nm (typically in the region of 13 nm), this of course affects the efforts to be made for complying with the stringent requirements made of the accuracy of the positioning and/or orientation of the components involved.

In connection with the abovementioned stabilization of the optical system, dealing with vibrational energy which arises in the system or is introduced into the system from outside proves to be particularly problematic, however. One approach often used for solving this problem consists in actively influencing the position and/or orientation of individual or a plurality of the system components used, in particular optical elements used, in order to hold the relevant component at a predefined position and/or in a predefined orientation.

DE 102 05 425 A1 (Holderer et al.), the disclosure of which is incorporated herein by reference, in connection with the defined positioning and orientation of the facet elements of a facet mirror of an EUV system, discloses individually adjusting the facet elements and then holding them in the adjusted state via corresponding fixing forces.

Although a misalignment of the facet elements as a result of introduced vibrational energy relative to the carriers thereof can be prevented in this case via correspondingly dimensioned fixing forces, what is problematic is that the carrier itself can be deformed by introduced vibrational energy, such that the facet elements can be deflected from their desired position and/or orientation in the beam path.

Moreover, active influencing of the position and/or orientation of individual or a plurality of optical elements of the imaging system is often desired in order to increase the flexibility of the optical system. In this regard, once again in the case of EUV systems, in particular in the illumination device, for flexible pupil formation it is desirable to use facet mirrors having a large number of movable (typically tiltable) micromirrors or facet elements, the respective position and/or orientation of which must then, of course, be set and held in a highly precise manner.

Particularly in the case of such EUV systems it is a particular challenge to realize the precise setting of the position and/or orientation of a large number of facet elements in conjunction with very small dimensions of the facet elements. In this regard, in the case of a facet mirror for such a EUV system, the number of facet elements is typically of the order of magnitude of several hundreds of thousands of facet elements, while the diameter of the optically effective surface of the individual facet element is typically of the order of magnitude of a several hundred micrometers.

Similar micromirror arrays comprising several hundreds of thousands of micromirrors are also known for example from U.S. Pat. No. 6,906,845 B2 (Cho et al.), the disclosure of which is incorporated herein by reference.

BRIEF SUMMARY OF THE INVENTION

Therefore, the present invention is based on the object of providing an optical module comprising an optical element, an optical imaging device, a method for supporting an optical element, an optical imaging method and a method for structuring a contact section of an optical module which do not have the abovementioned disadvantages, or have them at least to a lesser extent, and in particular ensure reliable positioning and/or orientation of an optical element in a simple manner.

The present invention is based on the insight that an improved support of an actively settable optical element, in particular even of tiniest facet elements, and thus an improved positioning and/or orientation of the optical element in the respective setting are achieved in a simple manner in an extremely small space if a selectively activatable contacting device is provided, which comprises a contact section which can selectively be brought into contact with a contact section of the optical element in order to exert a contact force thereon. The activated state of the contacting device and, thus, the contact or the contact force is preferably maintained until either a renewed adjustment (carried out for example in the course of a correction) of the position and/or orientation of the optical element becomes necessary or the operation of the optical module ends.

This contact force exerted selectively on the optical element makes it possible to hold the optical element in the position and/or orientation respectively set. In this case, the optical element can be fixed substantially rigidly by the contacting device. However, it is likewise also possible, via a correspondingly vibration-damping configuration of at least one damping section (located in the region of the optical element and/or of the contacting device), to achieve a targeted damping of vibrations that were introduced into the optical element, or to reduce, possibly even completely avoid, such introduction of vibrations.

In order to produce the contact between the contact section of the contacting device and the contact section of the optical element, either the contact section of the contacting device or the optical element (or both) can be actuated or moved. In this case, the actuation force can be generated in any desired manner according to any desired principle of operation. Preferably, the actuation force is generated in a contactless manner in order to achieve a particularly space-saving configuration.

In accordance with a first aspect, therefore, the present invention relates to an optical module, in particular facet mirror, comprising an optical element and a supporting structure for supporting the optical element, wherein the supporting structure comprises a positioning device for actively setting a position and/or orientation of the optical element in at least one degree of freedom. The supporting structure comprises a selectively activatable contacting device having at least one contacting unit having a first contact section, the first contact section, in an activated state of the contacting device, contacting a second contact section of the optical element in order to exert a contact force on the optical element, and the first contact section, in a deactivated state of the contacting device, being removed from the second contact section.

In accordance with a further aspect, the present invention relates to an optical imaging device, in particular for microlithography, comprising an illumination device having a first optical element group, a mask device for accommodating a mask comprising a projection pattern, a projection device having a second optical element group, and a substrate device for accommodating a substrate, the illumination device being designed for illuminating the projection pattern, in particular with light in the EUV range, and the projection device being designed for projecting the projection pattern onto the substrate. The illumination device and/or the projection device comprises an optical module according to the invention.

In accordance with a further aspect, the present invention relates to a method for supporting an optical element, in particular a facet element of a facet mirror, wherein the optical element is supported by a supporting structure, wherein a position and/or orientation of the optical element are/is set in at least one degree of freedom. A first contact section of a selectively activatable contacting device, in an activated state of the contacting device, is brought into contact with a second contact section of the optical element in order to exert a contact force on the optical element, while the first contact section is removed from the second contact section in a deactivated state of the contacting device.

In accordance with a further aspect, the present invention relates to an optical imaging method, in particular for microlithography, wherein an illumination device illuminates a projection pattern, in particular with light in the EUV range, and a projection device projects the projection pattern onto a substrate. An optical element, in particular a facet element of a facet mirror, of the illumination device and/or of the projection device is supported using a method according to the invention.

In accordance with a further aspect, the present invention relates to a method for structuring a contact section of an optical module according to the invention, wherein one of the two contact sections, in particular the first contact section, is configured as a structurable contact section at least section-wise comprising a structurable material which is hardenable after structuring, while the other of the two contact sections, in particular the second contact section, is configured as a structuring contact section at least section-wise having a stiffness sufficient for the defined structuring of the structurable contact section. The structurable contact section is structured in its structurable state by the structuring contact section for producing the complementarily structured first and second contact surfaces and is hardened after this structuring.

Further preferred configurations of the invention become apparent from the dependent claims and the following description of preferred embodiments, which refers to the accompanying drawings. Any combinations of the features disclosed, regardless of their being mentioned in the claims, belong to the subject matter of the invention.

DETAILED DESCRIPTION OF THE INVENTION

First Embodiment

A first embodiment of an optical imaging device 101 according to the invention is described below with reference to FIGS. 1 to 5. In order to simplify understanding of the following explanations, an orthogonal xyz-coordinate system was introduced into the accompanying drawings, in which the z-direction coincides with the direction of the gravitational force. It goes without saying, however, that any other orientation of this xyz-coordinate system or of the components of the optical imaging device in space can also be chosen in other variants of the invention.

Figure 1:
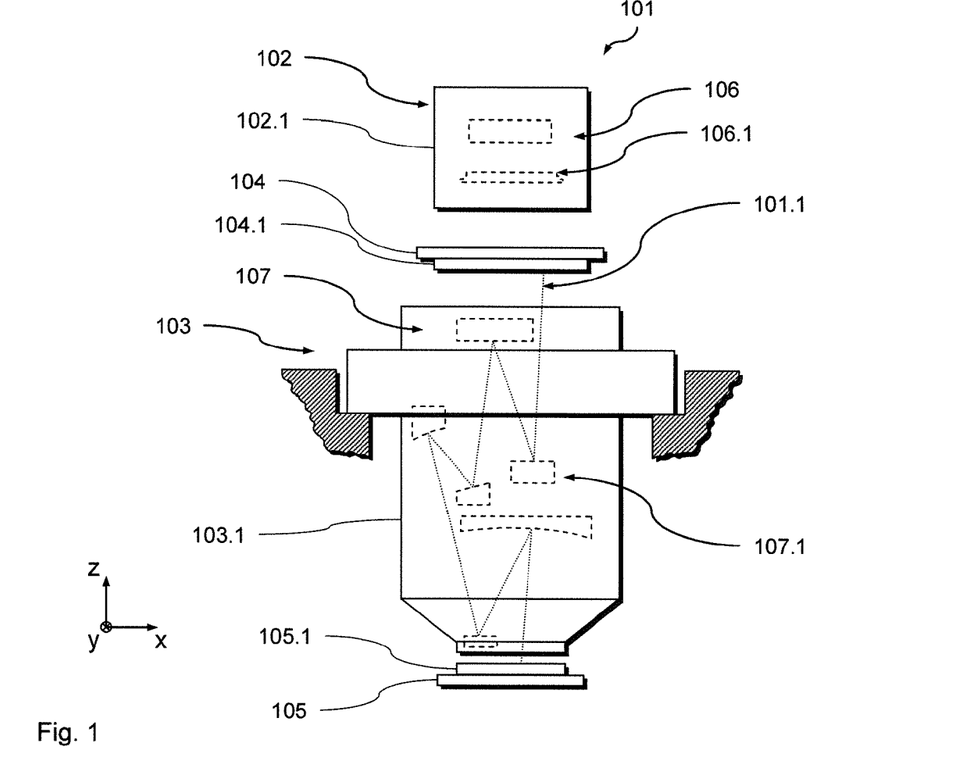
FIG. 1 is a schematic illustration of a preferred embodiment of an optical imaging device according to the invention, which comprises a preferred embodiment of an optical module according to the invention in which a preferred embodiment of a method according to the invention for supporting an optical element is applied.

FIG. 1 is a schematic illustration, not to scale, of the optical imaging device in the form of a microlithography device 101 used for producing microelectronic circuits. The imaging device 101 comprises an illumination device 102 and an optical projection device 103, which is designed to project, in an imaging process, an image of a projection pattern formed on a mask 104.1 of a mask device 104 onto a substrate 105.1 of a substrate device 105. For this purpose, the illumination device 102 illuminates the mask 104.1 with an illumination light beam (not illustrated in more specific detail). The projection device 103 then receives the projection light beam (indicated by the line 101.1 in FIG. 1) coming from the mask 104.1 and projects the image of the projection pattern of the mask 104.1 onto the substrate 105.1, for example a so-called wafer or the like.

The illumination device 102 comprises a system (illustrated only highly schematic in FIG. 1) of optical elements 106, the system comprising, inter alia, an optical module 106.1 according to the invention. As will be explained in greater detail below, the optical module 106.1 is configured as a facet mirror. The optical projection device 103 comprises a further system of optical elements 107, which comprises a plurality of optical modules 107.1. Here, the optical modules of the optical systems 106 and 107 are arranged along a folded optical axis 101.1 of the imaging device 101.

In the example shown, the imaging device 101 operates with light in the EUV range at a wavelength of between 5 nm and 20 nm, more precisely at a wavelength of approximately 13 nm. Consequently, the optical elements in the illumination device 102 and the projection device 103 are configured exclusively as reflective optical elements. It goes without saying, however, that any desired types of optical elements (e.g. refractive, reflective or diffractive optical elements) can be used in other variants of the invention which operate with other wavelengths, either individually or in any desired combination. Furthermore, the projection device 103 can also comprise a further optical module according to the invention, for example in the form of a further facet mirror.

Figure 2:
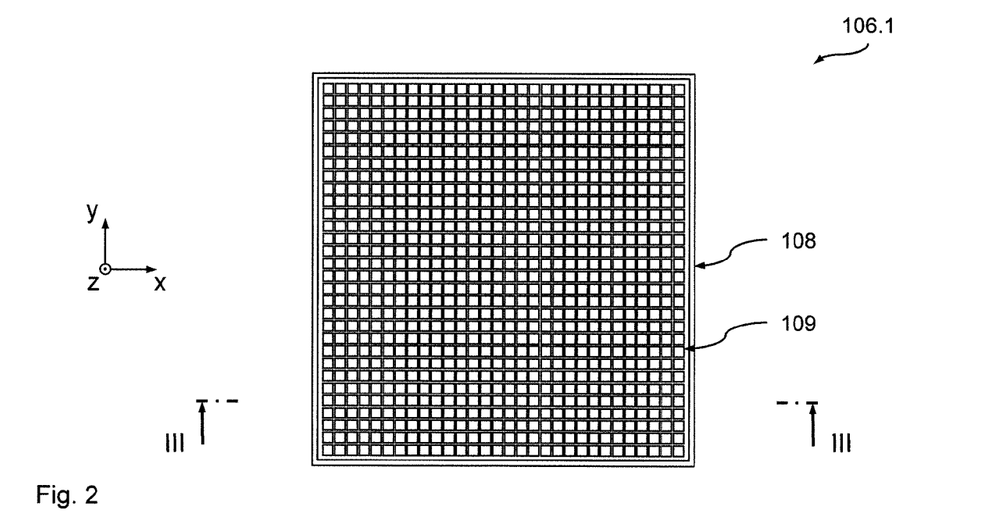
FIG. 2 is a schematic top view of the optical module according to the invention from FIG. 1.
Figure 3:
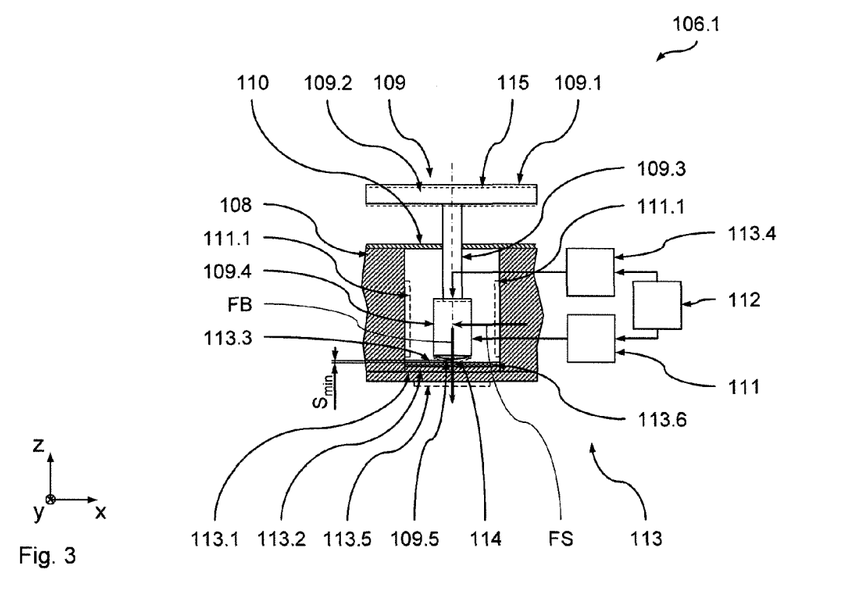
FIG. 3 is a schematic sectional view through a part of a preferred variant of the optical module from FIG. 2 (along line III-III from FIG. 2) in a first operating state.

As can be inferred from FIGS. 2 to 5, the facet mirror 106.1 comprises a supporting structure 108, which supports a multiplicity of optical elements in the form of facet elements 109 (only a single one of which is illustrated in FIG. 3). FIG. 2 illustrates only 900 facet elements 109, for reasons of clarity. In reality, however, the facet mirror 106.1 comprises approximately 400,000 facet elements 109, although it goes without saying that, in other variants of the invention, a deviating number of (arbitrary) optical elements can also be supported on a corresponding supporting structure.

It should be noted that, in facet devices, preferably as many facet elements as possible are provided in order to achieve homogenization of the light to the greatest possible extent. Particularly in facet devices, therefore, preferably 10,000 to 1,000,000, preferably 50,000 to 600,000, more preferably 200,000 to 500,000, facet elements are provided.

In the example shown, the facet elements 109 are arranged in a regular rectangular matrix such that a narrow gap of less than 0.05 mm to 0.02 mm remains between them in order to achieve the least possible loss of radiation power. It goes without saying, however, that any other arrangement of the optical elements supported by the supporting structure 108, depending on the optical requirements of the imaging device, can also be realized in other variants of the invention.

As can be inferred from FIGS. 2 to 5, the facet element 109 has a reflective and thus optically effective surface 109.1. The reflective surface 109.1 is formed on a front side of a facet body 109.2 of the facet element 109, the front side facing away from the supporting structure 108 and facing the illumination light beam.

The surface area of the optically effective surface 109.1 of the facet element 109 is preferably 0.05 mm$^2$ to 2.0 mm$^2$, more preferably 0.15 mm$^2$ to 0.5 mm$^2$. In the present example, the surface area of the optically effective surface 109.1 is between 0.2 mm$^2$ and 0.3 mm$^2$, namely 0.25 mm$^2$.

At the rear side (facing away from the reflective surface 109.1) of the facet body 109.2, there is provided a projection in the form of a columnar coupling element 109.3, via which the facet element 109 is connected to the supporting structure 108 via a connecting device 110. In the present example, the connecting device 110 is configured as an elastic membrane element or leaf spring element which is connected to the coupling element 109.3, on the one hand, and to the supporting structure 108, on the other hand.

The supporting structure 108 comprises a positioning device 111 (illustrated only highly schematically in FIG. 3) for actively setting a position and/or orientation of the facet element 109 in at least one degree of freedom. The relevant setting can be performed individually for each facet element 109. Likewise, however, in other variants of the invention, arbitrarily formed groups of facet elements 109 (up to and including all facet elements 109 of the facet mirror 106.1) can, of course, also be set jointly.

Via the positioning device 111, it is possible to set as many degrees of freedom as desired up to and including all six degrees of freedom in space. However, for simplification of the apparatus, preferably only those degrees of freedom are taken into account which have a non-negligible influence on the imaging error or the imaging quality of the imaging device 101 or whose influence on the imaging error or the imaging quality cannot be compensated for more simply elsewhere in the beam path.

In the present example, via the positioning device 111 it is possible, inter alia, to set the rotational degree of freedom of the facet element 109 about the y-axis, that is to say therefore the tilting of the facet element 109 about the y-axis. This can be used in the present example of an imaging device in the EUV range in the illumination device 102 for example for pupil variation or for a so-called setting change.

The positioning device 111 for this purpose is designed to exert an actuation force FS or a corresponding positioning moment MS about the y-axis on the facet element 109 in order to achieve the setting of the facet element 109 in the desired degree of freedom or degrees of freedom.

In the present example, this takes place in a contactless manner according to an electrostatic principle of operation. For this purpose, by way of example, positioning electrodes 111.1 can be provided on the supporting structure 108, which electrodes, in a manner controlled by a control device 112 connected to the positioning device 111, in the region of the facet element 109, establish corresponding electric fields in order to generate the positioning force FS or the positioning moment MS on the facet element 109.

It goes without saying, however, that, in other variants of the invention, the positioning force FS or the positioning moment MS can also be generated in any other manner desired, via positioning devices which operate in a contactless or alternatively in a tactile manner or are mechanically connected to the facet element 109.

The supporting structure 108 furthermore comprises a selectively activatable contacting device 113 having a contacting unit 113.1, which is designed to exert a contact force FK on the facet element 109 in an activated state, while in a deactivated state it does not exert such a contact force FK on the facet element 109 or is not in such mechanical interaction with the facet element 109.

Figure 4:
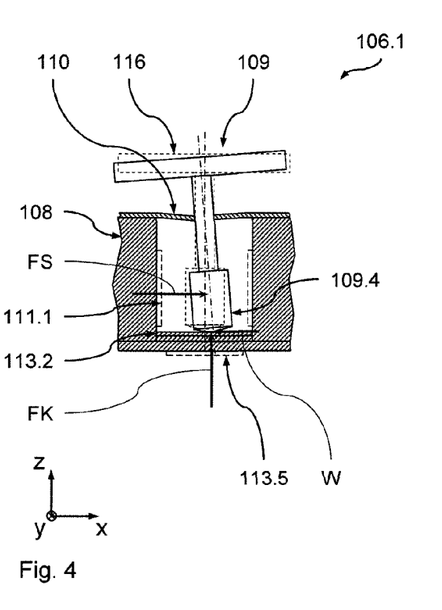
FIG. 4 is a schematic sectional view through the part of the optical module from FIG. 3 (along line III-III from FIG. 2) in a second operating state.
Figure 5:
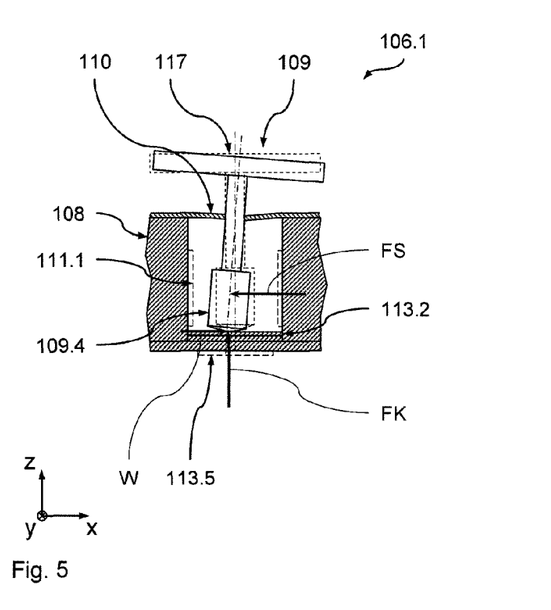
FIG. 5 is a schematic sectional view through the part of the optical module from FIG. 3 (along line III-III from FIG. 2) in a third operating state.
Figure 6:
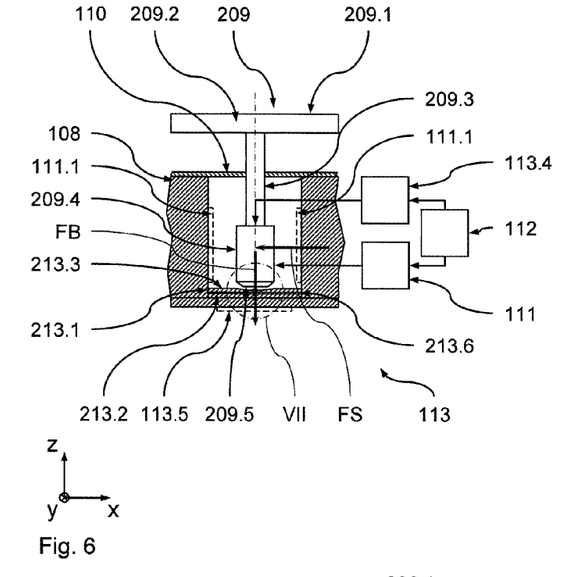
FIG. 6 is a schematic sectional view through a part of a further preferred variant of the optical module from FIG. 2 (along line III-III from FIG. 2) in a first operating state.
Figure 7:
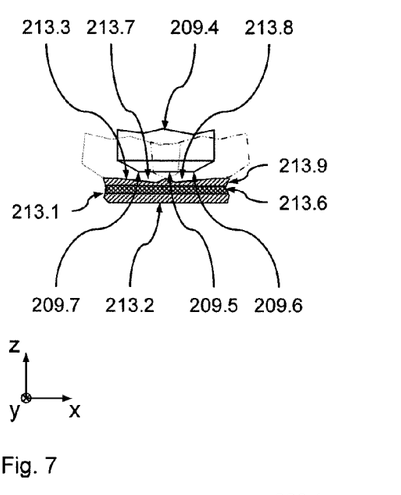
FIG. 7 is a schematic view of the detail VII from FIG. 6.

For this purpose, the contacting unit 113.1 comprises a first contact section 113.2, which contacts a second contact section 109.4 of the facet element 109 in the activated state of the contacting device 113, such that the contact force FK acts between the two contact partners 113.2 and 109.4 (substantially perpendicularly to the contact surface thereof; see FIGS. 4 and 5).

As can be inferred from FIG. 3, the second contact section 109.4 is arranged at the free end (facing away from the facet body 109.2) of the coupling element 109.3. The second contact section 109.4 is arranged adjacent to the first contact section 113.2 in the deactivated state (illustrated in FIG. 3) of the contacting device 113 in such a way that, between a first contact surface 113.3 of the first contact section 113.2 and a second contact surface 109.5 of the second contact section 109.4, there is formed a narrow gap 114 having a minimum gap width $S_{min}$ (perpendicular to the first contact surface 113.3).

In the deactivated state of the contacting device 113, the gap 114 or the minimum gap width $S_{min}$ is at least just large enough that the positioning device 111 can adjust the facet element 109 without appreciable contact between the first contact surface 113.3 and the second contact surface 109.5 (or appreciable resistance resulting therefrom).

In the present example, the minimum gap width $S_{min}$ is 10 μm. It goes without saying, however, that a different minimum gap width $S_{min}$ can also be chosen in other variants of the invention. Preferably, the minimum gap width $S_{min}$ is 0.1 μm to 10,000 μm, preferably 1 μm to 1,000 μm, more preferably 2 μm to 100 μm.

If the contacting device 113 is activated in a manner controlled by the control device 112, then the contacting device 113 exerts on the facet element 109 along the z-axis an actuation force FB (see FIG. 3) which moves the facet element 109 in the present example with elastic deformation of the connecting device 110 toward the (substantially stationary) contacting unit 113.1 until the first contact surface 113.3 and the second contact surface 109.5 bear against one another under the contact force FK (as is illustrated in FIGS. 4 and 5 for two different settings of the facet element 109, and indicated in FIG. 3 by the dashed contour 115).

The contacting device 113 exerts the actuation force FB in the present example in a contactless manner via an actuation device 113.4, by virtue of the fact that it again operates according to an electrostatic operative principle. For this purpose, by way of example, actuation electrodes 113.5 of the actuation device 113.4 can be provided on the supporting structure 108, which electrodes, in a manner controlled by the control device 112 connected to the contacting device 113, in the region of the facet element 109, establish corresponding electric fields in order to generate the actuation force FB on the facet element 109 or the contact force FK between the first contact section 113.2 and the second contact section 109.4, respectively.

It goes without saying, however, that the actuation force FB or the contact force FK, respectively, in other variants of the invention can also be generated in any other desired manner via devices which operate in a contactless or alternatively tactile manner or are mechanically connected to the facet element 109, respectively.

In the present example, the first contact surface 113.3 is configured as a substantially planar surface, while the second contact surface 109.5 is configured as an at least singularly curved surface, the one principal curvature axis of which runs substantially parallel to the y-axis (that is to say substantially parallel to the axis of the rotational degree of freedom that can be set).

If the facet element 109 is not intended to be set in the rotational degree of freedom about the x-axis, then the second contact surface 109.5 can be a singularly curved surface, that is to say a substantially cylindrical surface. In the activated state of the contacting device 113, a linear contact zone having a greater or lesser area depending on the stiffness of the two contact partners 113.2, 109.4 (and, of course, magnitude of the contact force FK) is then present.

However, if a setting of the facet element 109 in the rotational degree of freedom about the x-axis is intended to be possible as well, then the second contact surface 109.5 is a doubly curved, that is to say substantially ellipsoidal or spherical, surface. In the activated state of the contacting device 113, a dot shaped contact zone having a greater or lesser area depending on the stiffness of the two contact partners 113.2, 109.4 (and, of course, magnitude of the contact force FK) is then present.

The contact between the first contact section 113.2 and the second contact section 109.4 firstly has the advantage, in principle, that additional dissipation of heat from the facet element 109 into the supporting structure 108 can be achieved by this approach. In this case, the linear contact zone has the advantage owing to its larger spatial extent relative to the dot shaped contact zone that it enables improved heat transfer from the facet element 109 into the supporting structure 108, such that once again increased dissipation of heat from the facet element 109 into the supporting structure 108 can be achieved.

Furthermore, in the activated state of the contacting device 113, a frictionally locking connection is achieved in at least one frictionally locking direction parallel to the first contact surface 113.3 (that is to say, in the present example, in the directions parallel to the xy-plane, in particular parallel to the x-axis), as a result of which the facet element 109, in the respective position and/or orientation of the facet element 109 set by the positioning device 111, is held in its position, even under the influence of vibrations introduced into the facet element 109, as long as the vibrational energy does not exceed a specific threshold. The threshold is defined by the present static friction force FHR governed by the present contact force FK and the frictional conditions in the contact zone, in particular the coefficient of friction between the two contact partners 113.2, 109.4.

The facet element 109 is deflected only if the force which results from the vibrational energy and which has a dislocating effect on the facet element 109 parallel to the frictionally locking direction exceeds the static friction force (and possibly holding forces of the positioning device 111 that additionally also have an effect). Consequently, the present invention therefore firstly makes it possible to reduce the holding forces of the positioning device 111.

Secondly, by virtue of the contact between the two contact partners 113.2, 109.4 and the resultant fixing of the facet element 109 in its respective setting, for the purpose of stabilizing this setting, it is not necessary to provide for the positioning device 111 to be controlled by closed-loop control that compensates for the vibration influences. Even in the case of a high bandwidth of the vibrations that occur during operation, therefore, closed-loop control having a correspondingly high control bandwidth is not required. Rather, simple activation or deactivation of the contacting device 113 by the control device 112 is sufficient after the setting of the facet element 109 has been carried out or before renewed setting of the facet element 109. In this case, only a significantly smaller bandwidth is required for driving the contacting device 113.

In the present example, the respective principal curvature of the second contact surface 109.5 is preferably adapted to the positioning movement (generated by the positioning device 111) of the facet element 109 such that the gap 114 or the minimum gap width $S_{min}$ remains substantially unchanged in each setting. Accordingly, the facet element 109, upon activation of the contacting device 113, is moved toward the contacting unit 113.1 by the same distance in each setting until the first contact surface 113.3 and the second contact surface 109.5 bear against one another under the contact force FK.

It goes without saying, however, that the respective principal curvature of the second contact surface 109.5, in other variants of the invention, can also be configured in such a way that the gap 114 or the minimum gap width $S_{min}$ varies with increasing deflection from the neutral position (illustrated in FIG. 3 and indicated in FIGS. 4 and 5 by the dashed contours 116 and 117, respectively) of the facet element 109 in order to minimize undesired influences of the movement of the facet element 109 on the imaging quality upon activation of the contacting device 113. In this regard, provision can be made, for example, for the gap 114 or the minimum gap width $S_{min}$ to at least section-wise decrease with increasing deflection from the neutral position (illustrated in FIG. 3) of the facet element 109. Likewise, additionally or alternatively, an at least in section-wise increase with increasing deflection can be provided.

It should be mentioned at this point that the configuration chosen in the present example with an exclusively frictionally locking connection in the contact zone between the two contact partners 113.2, 109.4 has the advantage that any desired settings or deflections of the facet element 109 from its neutral position can be performed without an appreciable variation of the fixing effect of the facet element 109 occurring.

In the present example, it is furthermore provided that the control device 112 can vary the contact force FK in the activated state of the contacting device 113, such that in the frictionally locking direction a settable static friction force FHR or (once the static friction force FHR has been overcome) a settable sliding friction force FGR acts as an adjusting resistance W against the positioning force FS of the positioning device.

It is thereby possible to reduce the adjusting resistance in a setting state of the activated state of the contacting device 113 in such a way that the positioning force FS of the positioning device 111 suffices to perform a setting of the facet element 109 with a frictional relative movement between the two contact surfaces 113.3, 109.5 against the adjusting resistance W.

In a fixing state of the activated state of the contacting device 113, the adjusting resistance W can then be increased by the control device 112 relative to the setting state in such a way that the maximum positioning force $FS_{max}$ of the positioning device 111 no longer suffices to perform a setting of the facet element 109 against the adjusting resistance W.

In the present example, the facet element 109 furthermore has at least one first resonant frequency, which is in the range of approximately 600 Hz. For its part, the contacting unit 113.1 has a damping section 113.6, which has a vibration-damping effect in the range of the first resonant frequency in order to minimize the influence of vibrations on the imaging quality precisely in this critical resonance range of the facet element.

Furthermore, the arrangement comprising the facet element 109 and the connecting device 110 has at least one second resonant frequency, which is approximately 750 Hz. The damping section 113.6 is configured such that it has a vibration-damping effect in the range of the second resonant frequency, too, in order to minimize the influence of vibrations on the imaging quality also in this critical resonance range of the arrangement comprising the facet element 109 and the connecting device 110.

It goes without saying, however, that the facet element 109, in other variants of the invention, can also have one or more other first resonant frequencies and/or one or more other second resonant frequencies, which are preferably 1 Hz to 2,000 Hz, preferably 50 Hz to 1,500 Hz, more preferably 200 Hz to 1,000 Hz.

In the present example, the positioning device 111 is furthermore configured such that it can be operated as an active release device which supports the release of the contact between the first contact section 113.2 and the second contact section 109.4 after deactivation of the contacting device 113 by a first release force FL1. In the present example, this occurs by virtue of the fact that a varying, possibly even alternating, positioning force FS is generated via the positioning device 111, that is to say that vibrational energy is thus introduced into the facet element 109 in a defined manner.

The first release force FL1 supports the second release force FL2, namely the releasing restoring force from the deformed connecting device 110, and helps to release or overcome restraining surface forces (e.g. van der Waals forces) between the first contact section 113.2 and the second contact section 109.4.

It goes without saying here that, in other variants of the invention, additionally or alternatively, provision can also be made for the release process to be supported in some other way after the deactivation of the contacting device 113. In this regard, a corresponding release device which generates a corresponding release force can be provided in the region of the contacting unit 113.1. Likewise, additionally or alternatively, the actuation device 113.4 can generate a corresponding release force.

As already mentioned, FIGS. 4 and 5 show the activated state of the contacting device 113 for two different settings of the facet element 109, for example the two opposite extreme deflections of the facet element 109 from its neutral position (see contour 116 in FIG. 4 and contour 117 in FIG. 5, respectively). It goes without saying that, in the present example, depending on the setting resolution of the positioning device 111, as many intermediate states as desired can be realized between these extreme positions, such that a particularly sensitive setting of the facet element 109 is possible.

Second Embodiment

A further preferred embodiment of the optical module 206.1 according to the invention is described below with reference to FIGS. 1, 2, and 6 to 9. The optical module 206.1 can be used instead of the optical module 106.1 in the imaging device 101. In terms of its fundamental configuration and functioning, the optical module 206.1 corresponds to the optical module from FIGS. 3 to 5, and so only the differences will be discussed here. In particular, identical components are provided with the identical reference signs, while components of the same type are provided with reference signs increased by the value 100. Unless indicated otherwise hereinafter, reference is made to the above explanations in connection with the first embodiment with regard to the features, functions and advantages of the components.

Figure 8:
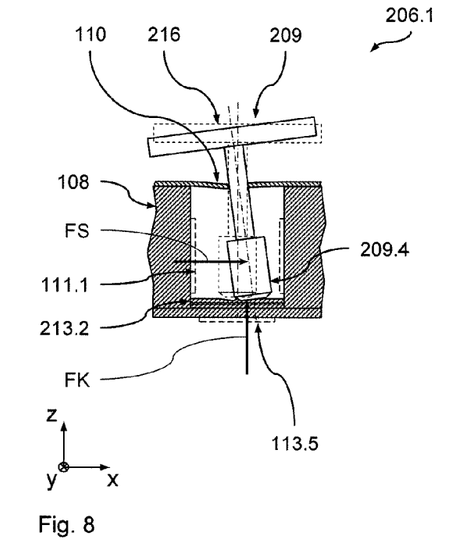
FIG. 8 is a schematic sectional view through the part of the optical module from FIG. 6 in a second operating state.
Figure 9:
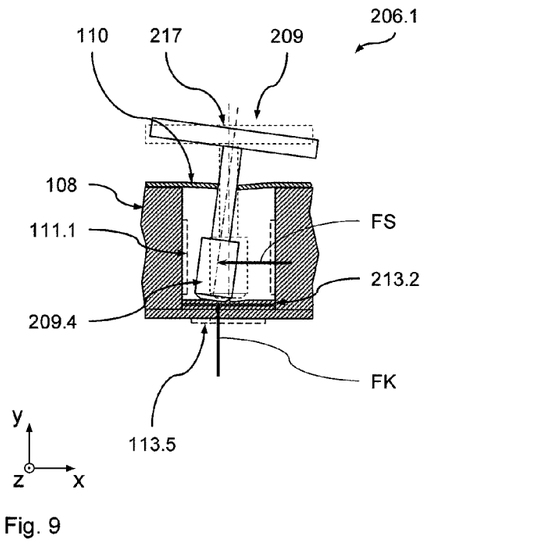
FIG. 9 is a schematic sectional view through the part of the optical module from FIG. 6 in a third operating state.

The essential difference with respect to the embodiment from FIGS. 3 to 5 consists in the configuration of the contacting device 213, wherein, in the present example, the first contact surface 213.3 of the first contact section 213.2 and the second contact surface 209.5 of the second contact section 209.4 are structured complementarily in such a way that, in the activated state of the contacting device 213, they form a positively locking connection in at least one positively locking direction (in the present example the direction parallel to the x-axis) in the case of the discrete settings illustrated in FIGS. 8 and 9.

For this purpose, the first contact surface 213.3 has two corresponding depressions 213.7 and 213.8, into which a complementarily configured projection 209.6 and 209.7, respectively, of the second contact surface 209.5 engages in each case in the respective setting (in the activated state of the contacting device 213).

In the present example, the complementary configuration for producing the positively locking connection in the activated state is achieved via mutually correspondingly complementary polygonal sectional contours of the contact surfaces 213.3 and 209.5 in a sectional plane containing a surface normal to the respective contact surface (in the present example the xz-plane).

It goes without saying, however, that, in other variants of the invention, any other sectional contour of the contact surfaces 213.3 and 209.5 can also be provided, as long as the latter are configured complementarily with respect to one another in the respective setting in such a way that they engage in one another in the activated state in order to achieve a positively locking connection in a desired positively locking direction.

Furthermore, a contact zone having a comparatively large area is achieved as a result of the complementary structuring of the two contact surfaces 213.3 and 209.5. This has the advantage that, relative to the first embodiment, further improved heat transfer from the facet element 209 into the supporting structure 108 results, such that once again increased dissipation of heat from the facet element 209 into the supporting structure 108 can be achieved.

The complementary structuring of the two contact surfaces 213.3 and 209.5 is achieved in the present example by the first contact section 213.2 being configured as a structurable contact section. For this purpose, in the region 213.9 situated on that side of the damping section 213.6 which faces the facet element 209, the first contact section 213.2 is formed from a structurable material which is hardenable after structuring. By contrast, the second contact section 209.4 is configured as a structuring contact section having a stiffness sufficient for the defined structuring of the structurable first contact section 213.2.

In order to achieve the structuring of the first contact section 213.2, the structurable first contact section 213.2 is structured in its structurable state by the structuring second contact section 209.4 by virtue of the fact that firstly the positioning device 111 brings the facet element 209 into a first setting and then the contacting device 213 is activated, such that the facet element 209 is pressed with its second contact section 209.4 into the structurable first contact section 213.2 until the arrangement illustrated in FIG. 8 is achieved.

Afterward, the contacting device 213 is deactivated, the facet element 209 is brought into a second setting by the positioning device 111 and then the contacting device 213 is activated anew, such that the facet element 209 is pressed with its second contact section 209.4 into the structurable first contact section 213.2 until the arrangement illustrated in FIG. 9 is achieved.

Afterward, the structurable region 213.9 of the first contact section 213.2 is hardened in order to achieve the structured first contact surface 213.3 illustrated in FIGS. 6 to 9, which has a sufficient stiffness to be able to achieve the above-described positively locking connection in the desired positively locking direction.

In order to ensure that the first contact section 213.2 structured in this way maintains its structuring to a sufficient extent during this process, the hardenable material of the structurable region 213.9 has a gel-like or waxy consistency in its structurable state.

In this case, the hardenable material of the structurable region 213.9 in the present example has in its structurable state a dimensional stability which suffices to obtain, after the influence of an acceleration corresponding to at least 100%, preferably at least 125%, more preferably substantially 150%, of the acceleration due to gravity, a dimensional fidelity with respect to the structuring contact section of at least 80%, preferably at least 90%, more preferably substantially 100%.

Preferably, the dimensional stability of the hardenable material is chosen such that, under all accelerations which can occur during handling until the final hardening of the material, the material maintains a dimensional fidelity with respect to the structuring second contact section 209.4 that suffices for the desired later positively locking connection.

The structurable and hardenable material used is preferably at least one material from a material group consisting of a photoresist material, a multi-component adhesive, in particular curable by UV light, and a, in particular thermally curable, powder coating material. The photoresist material used can be, in principle, any desired photoresists such as are used in microsystems engineering, in particular in semiconductor lithography.

It goes without saying, however, that the complementary structuring of the two contact surfaces 213.3 and 209.5 can also be carried out in some other way in other variants of the invention. In this regard, by way of example, the roles of the two contact surfaces 213.3 and 209.5 can be interchanged, that is to say, therefore, that the first contact section 213.2 can form the structuring contact section, while the second contact section 209.4 is configured as a structurable contact section. Likewise, of course, mixed forms of these two variants can also be provided, wherein the respective contact section is configured partly as a structurable and partly as a structuring contact section.

It likewise goes without saying that the complementary structuring of the two contact surfaces 213.3 and 209.5, in other variants of the invention, can also be produced in each case individually by separate shaping production and/or reworking by any desired primary forming and/or material-removing and/or material-applying methods.

In the present example, during the operation of the imaging device 101, the facet element 209 has the two settings illustrated in FIGS. 8 and 9. It is thereby possible to achieve an on/off function, for example, wherein the facet element 209, for example in the setting from FIG. 8, passes on impinging light in such a way that it can be used as used light in the present imaging process, while the impinging light is removed from the used beam path in the setting from FIG. 9. In other variants of the invention in which light losses are avoided, it is also possible to achieve only a deflection to different used regions.

Furthermore, it goes without saying that more than two discrete settings can also be provided in other variants of the invention. In this case, of course, a corresponding number of sections of the two contact surfaces 213.3 and 209.5 that correspondingly engage in one another in a positively locking manner (in the activated state of the contacting device 213) is then provided.

Third Embodiment

A further preferred embodiment of the optical module 306.1 according to the invention is described below with reference to FIGS. 1, 2, and 10 to 12. The optical module 306.1 can be used instead of the optical module 106.1 in the imaging device 101. In terms of its fundamental configuration and functioning, the optical module 306.1 corresponds to the optical module from FIGS. 6 to 9, and so only the differences will be discussed here. In particular, identical components are provided with the identical reference signs, while components of the same type are provided with reference signs increased by the value 100. Unless indicated otherwise hereinafter, reference is made to the above explanations in connection with the second embodiment with regard to the features, functions and advantages of the components.

The essential difference with respect to the embodiment from FIGS. 6 to 9 once again consists in the configuration of the contacting device 313. In this regard, in the present example, the contacting unit 313.1 of the contacting device 313 is indeed likewise equipped with a first contact surface 313.3 of the first contact section 313.2, which, in a manner identical to that in the case of the second embodiment, is structured complementarily with respect to the second contact surface 209.5 of the second contact section 209.4 in such a way that, in the activated state of the contacting device 313, they form a positively locking connection in at least one positively locking direction (in the present example the direction parallel to the x-axis) in the case of the two discrete settings illustrated in FIGS. 11 and 12. In this respect, reference should explicitly be made to the above explanations concerning the second embodiment.

Figure 11:
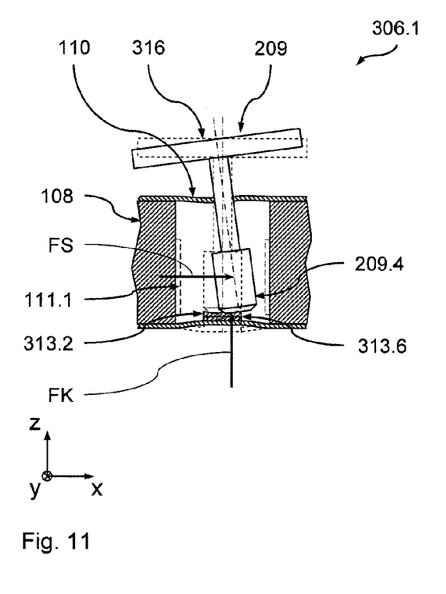
FIG. 11 is a schematic sectional view through the part of the optical module from FIG. 10 in a second operating state.
Figure 12:
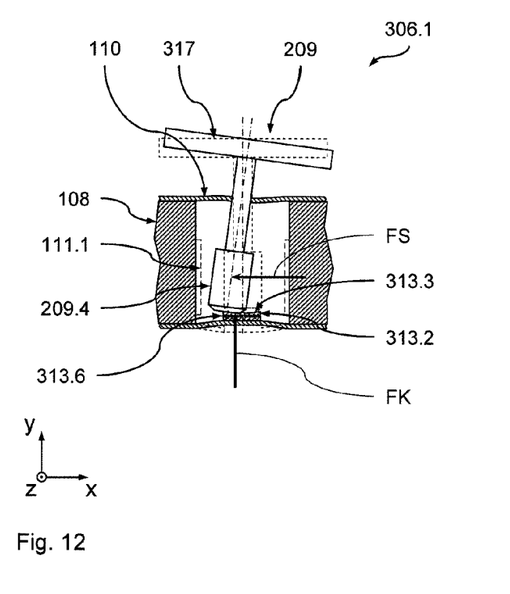
FIG. 12 is a schematic sectional view through the part of the optical module from FIG. 10 in a third operating state.

In the present example, however, the facet element 209 is configured as an element which is substantially stationary in the respective setting (set by the positioning device 111). By contrast, upon the activation of the contacting device 313 (by the control device 112), the actuation device 313.4 exerts on the contacting unit 313.1 along the z-axis an actuation force FB (see FIG. 10), which moves the contacting unit 313.1 in the present example with elastic deformation of the carrier 313.10 of the contacting unit 313.1 toward the (substantially stationary) facet element 109 until the first contact surface 313.3 and the second contact surface 209.5 bear against one another under the contact force FK (as is illustrated in FIGS. 11 and 12 for two different settings of the facet element 209).

In the present example, the carrier 313.10 is configured such that it assumes a stable state in the respective setting (via the positioning device 111) in the activated state of the contacting device 313 (see FIGS. 11 and 12) and in the deactivated state of the contacting device 313 (see FIG. 10), from which stable state the carrier can be moved only by a corresponding actuation force FB being applied. For this purpose, the carrier 313.10 is configured as a bistable elastic element (for example as a membrane-like or leaf-spring-like element) having an arcuate or pot-shaped sectional contour.

In the present example, the contacting device 313 exerts the actuation force FB once again in a contactless manner via an actuation device 313.4 by virtue of the fact that it once again operates according to an electrostatic operative principle. Likewise, additionally or alternatively it is also possible, of course, to provide actuation mechanisms which operate with a direct mechanical connection to the contacting unit 313.1 or the elastic carrier 313.10. By way of example, corresponding actuators (for example piezo-actuators) can act on the regions of the elastic carrier 313.10 which lie between the contacting unit 313.1 and the supporting structure 108 in order to introduce into the elastic carrier 313.10 corresponding bending moments for changeover between the two stable end positions of the elastic carrier 313.10.

This bistable configuration has the advantage that energy has to be applied only for changing over between the two end positions of the elastic carrier 313.10, while no energy need be applied at all other points in time. This is advantageous with regard to the introduction of disturbing thermal energy and thermal energy that then has to be dissipated again, respectively, into the imaging device 101.

It goes without saying that such a bistable configuration can, if appropriate, also be realized in the other two embodiments via a corresponding configuration of the connecting device 110.

Figure 10:
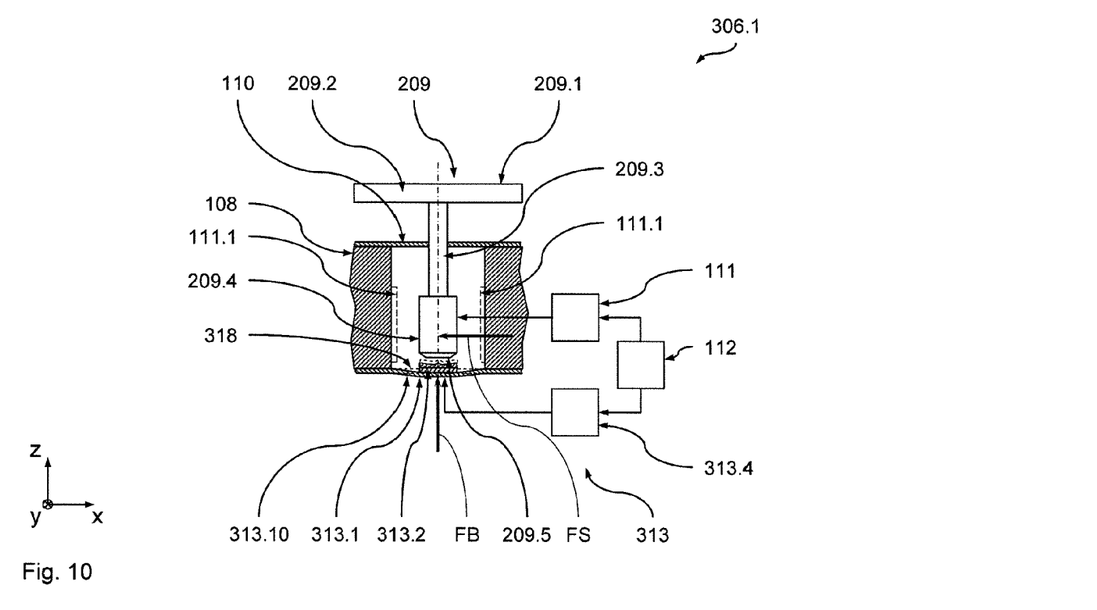
FIG. 10 is a schematic sectional view through a part of a further preferred variant of the optical module from FIG. 2 (along line III-III from FIG. 2) in a first operating state.

Likewise, it is also possible, of course, in the third embodiment, to provide a conventional configuration of the carrier as a simple membrane-like or leaf-spring-like element, as is indicated by the dashed contour 318 in FIG. 10. In this case, a corresponding actuation force FB must then always be applied in the activated state in order to achieve the contact force FK. In this case, the carrier 318 then exerts a release force which then at least supports the release of the contact between the first contact surface 313.3 and the second contact surface 209.5.

Alternatively, it is also possible, of course, to provide a configuration wherein the contact between the first contact surface 313.3 and the second contact surface 209.5 in the activated state is always (i.e. without supply of energy) achieved via a corresponding mechanical prestress of the carrier, while in the deactivated state a corresponding actuation force FB has to be applied in order to release the contact between the first contact surface 313.3 and the second contact surface 209.5 with further elastic deformation of the carrier.

The present invention has been described above exclusively on the basis of facet mirrors. It goes without saying, however, that the invention can also be used in connection with any other optical modules and/or optical elements.

Furthermore, the present invention has been described above exclusively on the basis of examples from the field of microlithography. It goes without saying, however, that the invention can also be used in connection with any other optical applications, in particular imaging methods at other wavelengths.

The invention claimed is:

1. An optical module, comprising:
  an optical element;
  a supporting structure supporting the optical element, the supporting structure comprising:
    a positioning device configured to actively set a position and/or an orientation of the optical element in at least one degree of freedom; and
    a selectively activatable contacting device comprising a contacting unit having a first contact section,
  wherein:
    in an activated state of the contacting device, the first contact section contacts a second contact section of the optical element to exert a contact force on the optical element;

in a deactivated state of the contacting device, the first contact section is not in contact with the second contact section;

the first contact section has a first contact surface;

the second contact section has a second contact surface;

the first and second contact surfaces are configured so that, in at least one position and/or orientation set by the positioning device, the first and second contact surfaces define a frictionally locking connection in at least one frictionally locking direction in the activated state of the contacting device; and at least one of the first and second contact surfaces is curved in at least some sections.

2. The optical module of claim 1, wherein at least one of the following holds:

a) the contacting device is configured so that, in the activated state of the contacting device, the contacting device exerts an actuation force on the optical element and/or the contacting unit so that the first and second contact sections contact each other;

b) the contacting unit is a substantially stationary element so that, in the activated state of the contacting device, the optical element is moved by the actuation force; and c) the optical element is substantially stationary in terms of its position and/or orientation set by the positioning device, the contacting unit is moved by the actuation force when the contacting unit is in its activated state, and the contacting unit is a bistable unit that is in a stable state when the contacting unit is in its activated state or its inactivated state.

3. An optical module, comprising:

an optical element;

a supporting structure supporting the optical element, the supporting structure comprising:

a positioning device configured to actively set a position and/or an orientation of the optical element in at least one degree of freedom; and a selectively activatable contacting device comprising a contacting unit having a first contact section, wherein:

in an activated state of the contacting device, the first contact section contacts a second contact section of the optical element to exert a contact force on the optical element;

in a deactivated state of the contacting device, the first contact section is not in contact with the second contact section the first contact section has first and second surface;

the first and second contact surfaces are structured complementarily so that in at least one position and/or orientation set by the positioning device, the first and second contact surfaces define a positively locking connection in at least one positively locking direction in the activated state of the contacting device; and at least one of the first and second contact surfaces has an at least section-wise polygonal sectional contour in a sectional plane containing a surface normal to the contact surface.

4. The optical module of claim 3, wherein in a plurality of discrete positions and/or orientations set by the positioning device, the first and second contact surfaces define a positively locking connection in at least one positively locking direction in the activated state of the contacting device.

5. The optical module of claim 3, wherein:

at least one of the first and second contact sections is a structurable contact section at least in section-wise comprising a structurable material which is hardenable after structuring;

the other of the first and second contact sections is a structuring contact section at least in section-wise has a stiffness sufficient for the defined structuring of the structurable contact section;

the first and second contact sections are configured so that the structurable contact section is structured in its structurable state via the structuring contact section to produce the complementarily structured first and second contact surfaces and having been hardened after this structuring;

the structurable and hardenable material having a gel-like or waxy consistency in its structurable state; and the structurable and hardenable material in its structurable state has a dimensional stability which suffices to obtain, after an influence of an acceleration corresponding to at least 100% of the acceleration due to gravity and a dimensional fidelity with respect to the structuring contact section of at least 80%; and the structurable and hardenable material comprise at least one material selected from the group consisting of a photoresist material, a multi-component adhesive, and a powder coating material.

6. The optical module of claim 5, wherein:

the first contact section is a structurable contact section at least in section-wise comprising a structurable material which is hardenable after structuring; and the second contact sectionsis a structuring contact section at least in section-wise having a stiffness sufficient for the defined structuring of the structurable contact section.

7. The optical module of claim 1, wherein:

the contacting device is configured so that, in the activated state of the contacting device, in the frictionally locking direction, a settable frictional force acts as an adjusting resistance against a positioning force of the positioning device;

the adjusting resistance is reduced in a setting state of the activated state of the contacting device so that that the positioning force of the positioning device suffices to set the optical element in the at least one degree of freedom with a frictional relative movement between the first and second contact surfaces against the adjusting resistance; and the adjusting resistance is increased in a fixing state of the activated state of the contacting device relative to the setting state so that a maximum positioning force of the positioning device does not suffice to perform a setting of the optical element in the at least one degree of freedom against the adjusting resistance.

8. An optical module, comprising:

an optical element;

a supporting structure supporting the optical element, the supporting structure comprising:

a positioning device configured to actively set a position and/or an orientation of the optical element in at least one degree of freedom; and a selectively activatable contacting device comprising a contacting unit having a first contact section, wherein:
in an activated state of the contacting device, the first contact section contacts a second contact section of the optical element to exert a contact force on the optical element;
in a deactivated state of the contacting device, the first contact section is not in contact with the second contact section; and
at least one of the following holds:
the optical element has a first resonant frequency of from one Hz to 2,000 Hz, and the contacting unit comprises a damping section which has a vibration-damping effect in the range of the first resonant frequency; and
the optical element is supported on the supporting structure via a supporting device, the supporting device has a second resonant frequency of from one Hz to 2,000 Hz, and the contacting unit comprises a damping section which has a vibration-damping effect in the range the second resonant frequency.

9. An optical module, comprising:
an optical element;
a supporting structure supporting the optical element, the supporting structure comprising:
a positioning device configured to actively set a position and/or an orientation of the optical element in at least one degree of freedom; and
a selectively activatable contacting device comprising a contacting unit having a first contact section,
wherein:
in an activated state of the contacting device, the first contact section contacts a second contact section of the optical element to exert a contact force on the optical element;
in a deactivated state of the contacting device, the first contact section is not in contact with the second contact section;
the optical element comprises an element body having a projection;
the element body comprises an optically effective surface;
the projection is arranged on a side of the element body facing away from the optically effective surface;
the second contact section is arranged at an end of the projection which faces away from the element body;
the contacting device comprises an actuation unit configured so that, in the activated state of the contacting device, the contacting device has an effect that an actuation force is exerted on the second contact section so that the first and second contact sections contact each other;
the positioning device is configured to exert the positioning force on the second contact section; and
the positioning device is configured to operate according to an electrostatic principle of operation.

10. The optical module of claim 9, wherein the actuation unit is configured to operate according to an electrostatic principle of operation.

11. An optical module, comprising:
an optical element;
a supporting structure supporting the optical element, the supporting structure comprising:
a positioning device configured to actively set a position and/or an orientation of the optical element in at least one degree of freedom; and
a selectively activatable contacting device comprising a contacting unit having a first contact section,
wherein:
in an activated state of the contacting device, the first contact section contacts a second contact section of the optical element to exert a contact force on the optical element;
in a deactivated state of the contacting device, the first contact section is not in contact with the second contact section;
the optical module comprises an active release device configured to provide a release force to support release of the contact between the first and second contact sections after deactivation of the contacting device;
the optical element is supported on the supporting structure via a supporting device which is elastically deformed in the activated state of the contacting device so that the supporting device exerts a second release force on the optical element which supports the release of the contact between the first and second contact sections;
the contacting unit has a release section which, in the activated state of the contacting device, is elastically deformed so that the contacting unit exerts a third release force on the first contact section which supports the release of the contact between the first and second contact sections; and
the release device is configured to introduce vibrational energy into the optical element and/or the contacting unit.

12. An optical imaging device, comprising:
an illumination device configured to illuminate a projection pattern of a mask; and
a projection device configured to project the illuminated projection pattern of the mask onto a substrate,
wherein:
the illumination device and/or the projection device comprises an optical module according to claim 1; and
the optical imaging device is a microlithography optical imaging device.

13. A method of using a microlithography optical imaging device comprising an illumination device and a projection device, the method comprising:
using the illumination device to illuminate a projection pattern of a mask; and
using a projection device to project the illuminated projection pattern of the mask onto a substrate,
wherein the illumination device and/or the projection device comprises an optical module according to claim 1.

14. A method, comprising:
providing an optical module according to claim 5;
structuring the structurable contact section via the structuring contact section to produce the complementarily structured first and second contact surfaces; and
after structuring the structurable contact section, hardening the structurable contact section.

15. The method of claim 14, wherein:
the first contact section is a structurable contact section at least in section-wise comprising a structurable material which is hardenable after structuring; and
the second contact sections is a structuring contact section at least in section-wise having a stiffness sufficient for the defined structuring of the structurable contact section.

16. The method of claim 14, wherein at least one of the following holds:

the structurable and hardenable material having a gel-like or waxy consistency in its structurable state; and the structurable and hardenable material in its structurable state has a dimensional stability which suffices to obtain, after an influence of an acceleration corresponding to at least 100% of the acceleration due to gravity and a dimensional fidelity with respect to the structuring contact section of at least 80%; and the structurable and hardenable material comprise at least one material selected from the group consisting of a photoresist material, a multi-component adhesive, and a powder coating material.

17. The optical module of claim 1, wherein at least one of the first and second contact surfaces is planar in at least some sections.

18. A mirror, comprising:
an optical module according to claim 1,
wherein the mirror is a facet mirror.

19. The mirror of claim 18, wherein at least one of the following holds:
the facet mirror comprises a facet element with an optically effective surface with an area 0.05 $mm^2$ to 2.0 $mm^2$; and
the facet mirror comprises 10,000 to 1,000,000 facet elements.

20. A mirror, comprising:
an optical module according to claim 3,
wherein the mirror is a facet mirror.

21. The mirror of claim 20, wherein at least one of the following holds:
the facet mirror comprises a facet element with an optically effective surface with an area 0.05 $mm^2$ to 2.0 $mm^2$; and
the facet mirror comprises 10,000 to 1,000,000 facet elements.

22. A mirror, comprising:
an optical module according to claim 8,
wherein the mirror is a facet mirror.

23. The mirror of claim 22, wherein at least one of the following holds:
the facet mirror comprises a facet element with an optically effective surface with an area 0.05 $mm^2$ to 2.0 $mm^2$; and
the facet mirror comprises 10,000 to 1,000,000 facet elements.

24. A mirror, comprising:
an optical module according to claim 9,
wherein the mirror is a facet mirror.

25. The mirror of claim 24, wherein at least one of the following holds:
the facet mirror comprises a facet element with an optically effective surface with an area 0.05 $mm^2$ to 2.0 $mm^2$; and
the facet mirror comprises 10,000 to 1,000,000 facet elements.

26. A mirror, comprising:
an optical module according to claim 11,
wherein the mirror is a facet mirror.

27. The mirror of claim 26, wherein at least one of the following holds:
the facet mirror comprises a facet element with an optically effective surface with an area 0.05 $mm^2$ to 2.0 $mm^2$; and
the facet mirror comprises 10,000 to 1,000,000 facet elements.

28. An optical module, comprising:
an optical element;
a supporting structure supporting the optical element, the supporting structure comprising:
a positioning device configured to actively set a position and/or an orientation of the optical element in at least one degree of freedom; and
a selectively activatable contacting device comprising a contacting unit having a first contact section,
wherein:
in an activated state of the contacting device, the first contact section contacts a second contact section of the optical element to exert a contact force on the optical element;
in a deactivated state of the contacting device, the first contact section is not in contact with the second contact section;
the optical element is substantially stationary in terms of its position and/or orientation as set by the positioning device; and
the contacting unit is moved by the actuation force when the contacting unit is in its activated state.

29. The optical module of claim 28, wherein the contacting unit is a bistable unit that is in a stable state when the contacting unit is in its activated state or its inactivated state.

30. A mirror, comprising:
an optical module according to claim 28,
wherein the mirror is a facet mirror.

31. The mirror of claim 30, wherein at least one of the following holds:
the facet mirror comprises a facet element with an optically effective surface with an area 0.05 $mm^2$ to 2.0 $mm^2$; and
the facet mirror comprises 10,000 to 1,000,000 facet elements.

* * * * *

UNITED STATES PATENT AND TRADEMARK OFFICE
CERTIFICATE OF CORRECTION

| | | |
|---|---|---|
| PATENT NO. | : 9,599,788 B2 | Page 1 of 1 |
| APPLICATION NO. | : 14/809431 | |
| DATED | : March 21, 2017 | |
| INVENTOR(S) | : Jan Horn et al. | |

It is certified that error appears in the above-identified patent and that said Letters Patent is hereby corrected as shown below:

In the Claims

Column 15, Line 49, Claim 3, delete "section" and insert -- section; --.

Column 16, Line 34, Claim 6, delete "sectionis" and insert -- section is --.

Column 16, Line 46, Claim 7, delete "that that" and insert -- that --.

Column 17, Line 20, Claim 8, after "range", insert -- of --.

Signed and Sealed this
Twenty-fifth Day of July, 2017

Joseph Matal
*Performing the Functions and Duties of the*
*Under Secretary of Commerce for Intellectual Property and*
*Director of the United States Patent and Trademark Office*